United States Patent
Huang

[19]

[11] Patent Number: 5,918,119
[45] Date of Patent: Jun. 29, 1999

[54] PROCESS FOR INTEGRATING MOSFET DEVICES, COMPRISED OF DIFFERENT GATE INSULATOR THICKNESSES, WITH A CAPACITOR STRUCTURE

[75] Inventor: Jenn Ming Huang, Hsin-Chu, Taiwan

[73] Assignee: Taiwan Semiconductor Manufacturing Company, Ltd., Hsin-Chu, Taiwan

[21] Appl. No.: 08/986,529

[22] Filed: Dec. 8, 1997

[51] Int. Cl.[6] .................................................. H01L 21/8242
[52] U.S. Cl. ........................ 438/238; 438/253; 438/396
[58] Field of Search .................................. 438/238, 239, 438/253–256, 381, 396–399

[56] References Cited

U.S. PATENT DOCUMENTS

| | | | |
|---|---|---|---|
| 5,444,279 | 8/1995 | Lee | 257/316 |
| 5,502,009 | 3/1996 | Lin | 437/239 |
| 5,554,558 | 9/1996 | Hsu et al. | 437/60 |
| 5,631,188 | 5/1997 | Chang et al. | 438/253 |
| 5,633,520 | 5/1997 | Wu et al. | 257/315 |
| 5,759,887 | 6/1998 | Ito | 438/238 |
| 5,792,681 | 8/1998 | Chang et al. | 438/210 |
| 5,804,488 | 9/1998 | Shih et al. | 438/238 |

*Primary Examiner*—Joni Chang
*Attorney, Agent, or Firm*—George O. Saile; Stephen B. Ackerman

[57] ABSTRACT

A semiconductor fabrication sequence has been developed, allowing the integration of MOSFET devices, comprised of different gate insulator layer thicknesses, with a capacitor structure. The fabrication sequence features the use of a first insulator layer, to be used as a gate insulator layer, for a first MOSFET device. A first polysilicon layer is used for creation of a first polysilicon gate structure, on the first gate insulator layer, and for creation of a lower electrode shape, for a capacitor structure. A second gate insulator layer is grown, greater in thickness than the first gate insulator layer, to be used as the gate insulator layer for a second MOSFET device, then followed by the creation of a second polysilicon gate structure, on the second gate insulator layer, pattered from a second polysilicon layer. The second gate insulator layer is also used for the capacitor dielectric layer, of the capacitor structure, with the upper electrode shape, of the capacitor structure, is also formed from patterning of the second polysilicon layer.

22 Claims, 4 Drawing Sheets

PROCESS FOR INTEGRATING MOSFET DEVICES, COMPRISED OF DIFFERENT GATE INSULATOR THICKNESSES, WITH A CAPACITOR STRUCTURE

BACKGROUND OF THE INVENTION (1) Field of the Invention

The present invention relates to a fabrication process used to create metal oxide semiconductor field effect transistor, (MOSFET), devices, and more specifically to a fabrication sequence used to integrate devices, with different gate insulator thicknesses, and a capacitor structure, on a semiconductor chip.

(2) Description of Prior Art

The quest for increased device performance, as well as the goal of decreasing manufacturing costs, have directed the semiconductor industry to micro-miniaturization, or the creation of semiconductor devices, with sub-micron features. Micro-miniaturization has been mainly achieved via advances in specific semiconductor fabrication disciplines, such as photolithography and dry etching. The use of more advanced exposure tools, as well as the development of more sensitive photoresist materials, have enabled sub-micron features to be routinely obtained in photoresist layers. In addition the development of advanced dry etching tools and processes have allowed these sub-micron features, in masking photoresist layers, to be successfully transferred to underlying materials, used in the fabrication of advanced semiconductor devices.

The use of sub-micron features, such as sub-micron channel lengths for MOSFET devices, have led to the use of thin gate insulator layers, which in turn has allowed supply voltages in the range of about 3.3 V, to be used. The use of lower voltages reduce the reliability risk of hot electron injection, sometimes encountered using power 5.0 V, I/Os. However specific peripheral chip functions may still be comprised of longer channel lengths and thicker gate insulator layers, therefore needing the 5.0 supply voltage. Therefore fabrication processes, allowing MOSFET devices to be created, with different gate insulator layer thicknesses, is needed. In addition specific analog functions need capacitor structures that facilitate the operation of the analog integrated circuit. Therefore it would be beneficial to develop a fabrication process that allows the integration of a capacitor structure, exhibiting good voltage and temperature capacitance coefficients, with MOSFET devices, having different gate insulator layer thicknesses.

This invention will describe a fabrication process featuring the creation of MOSFET devices using dual gate insulator layer thicknesses, without covering either silicon surface with photoresist layers, prior to either gate insulator growth. In addition the capacitor structure is formed using a mixed mode procedure, using the polysilicon layers, also used for both gate structures of two MOSFET devices, as capacitor plates, while using one of the gate insulator layers, for the capacitor dielectric layer. Prior art, such as Lin, in U.S. Pat. No. 5,502,009, describes the creation of gate oxide layers, of different thicknesses using a silicon nitride layer to protect a first region, from the formation of a gate insulator layer on a second region. In contrast, this invention features a polysilicon layer, masking a first gate insulator layer, from an oxidation procedure used to create a second gate insulator layer, in a second region. In addition the masking polysilicon layer is subsequently patterned to form a polysilicon gate structure for a first MOSFET device, and to form a plate, for a subsequent capacitor structure.

SUMMARY OF THE INVENTION

It is an object of this invention to form MOSFET devices, with different gate insulator layer thicknesses on the surface of a semiconductor substrate, without exposing the surface of the semiconductor substrate to photoresist films, prior to gate insulator growth.

It is another object of this invention to integrate the formation of a capacitor structure, with the process used to create the MOSFET devices, with different gate insulator layer thicknesses.

In accordance with the present invention a semiconductor fabrication sequence is described that allows the integration of MOSFET devices, comprised of different gate insulator thicknesses, with a capacitor structure, to be achieved. After formation of isolation regions a first gate insulator layer is grown on a first region of a semiconductor substrate, to be used for a first MOSFET device, and on a second region of a semiconductor substrate to be used for a second MOSFET device. A first polysilicon is next deposited, followed by patterning, resulting in a portion of the first polysilicon layer, remaining on the underlying first gate insulator layer, in the first region of the semiconductor substrate, and resulting in the creation of a lower electrode shape, for a subsequent capacitor structure, on an underlying isolation region, in a third region of the semiconductor substrate. After removal of the first gate insulator layer from the unprotected surface of the semiconductor substrate, in the second region of the semiconductor substrate, a second gate insulator layer, different in thickness then the first gate insulator layer, is grown on the surface of the semiconductor substrate in the second region, and also grown on the exposed surface of the first polysilicon layer, overlying the first gate insulator layer, in the first region of the semiconductor substrate. The second gate insulator layer, to be used as a capacitor dielectric layer, is also grown on the exposed surface of the lower electrode shape, overlying the isolation layer, in the third region of the semiconductor substrate. A second polysilicon layer is next deposited followed by patterning, resulting in a portion of the second polysilicon layer remaining in the second region of the semiconductor substrate, overlying the second gate insulator layer, and resulting in the creation of an upper electrode shape, on the capacitor dielectric layer, in a third region of the semiconductor substrate. A final polysilicon patterning procedure is performed to the first polysilicon layer, creating a first polysilicon gate structure, overlying a first gate insulator layer, in the first region of the semiconductor substrate, and to the second polysilicon layer, creating a second polysilicon gate structure, overlying a second gate insulator layer, in the second region of the semiconductor substrate. Source and drain regions, and insulator spacers, are formed for the MOSFET devices in the first and second regions of the semiconductor substrate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
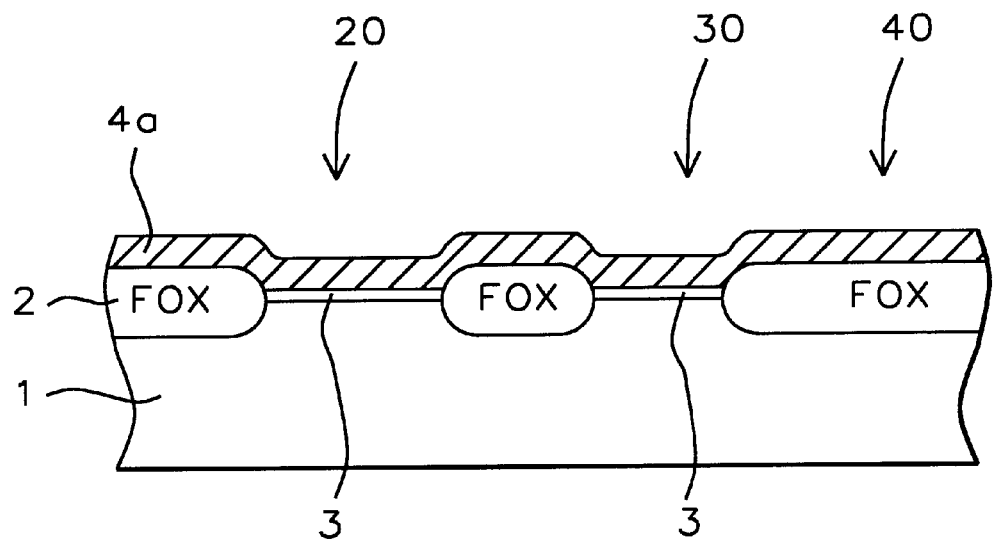
FIGS. 1–8, which schematically, in cross-sectional style, show the key stages of fabrication, used to integrate MOSFET devices, with different gate insulator layer thicknesses, with a capacitor structure.

The method of integrating MOSFET devices, with different gate insulator layer thicknesses, with a capacitor structure, will now be described in detail. A semiconductor substrate 1, comprised of P type, single crystalline silicon, having a <100> crystallographic orientation, is used and schematically shown in FIG. 1. Field oxide, (FOX), regions 2, are formed in exposed regions of semiconductor substrate 1, via a thermal oxidation procedure, at a temperature between about 900 to 1100° C. in an oxygen—steam ambient, to a thickness between about 2500 to 5000 Angstroms. An oxidation resistant, composite mask, comprised of silicon nitride on silicon oxide, is used to prevent growth of FOX regions 2, in subsequent device region 20, and subsequent device region 30. After removal of the oxidation resistant, composite mask, using hot phosphoric acid for the silicon nitride layer, and a buffered hydrofluoric acid for the underlying silicon oxide layer, a first gate insulator layer 3, of silicon dioxide, is thermally grown, in an oxygen—steam ambient, in device region 20, and in device region 30, at a temperature between about 800 to 1000° C. to a thickness between about 40 to 200 Angstroms. The thickness of first gate insulator layer 3, will subsequently allow the operation of a MOSFET device to be achieved at a voltage of between about 2.5.–3.3 volts. A first polysilicon layer 4a, is next deposited, via low pressure chemical vapor deposition, (LPCVD), procedures, at a temperature between about 550 to 650° C. to a thickness between about 1000 to 3000 Angstroms. First polysilicon layer 4a, can be deposited using in situ doping procedures, via the addition of either arsine, or phosphine, to a silane ambient, or first polysilicon layer 4a, can be grown intrinsically and doped via the ion implantation of either arsenic or phosphorous. The result of these process steps are schematically shown in FIG. 1.

Figure 2:
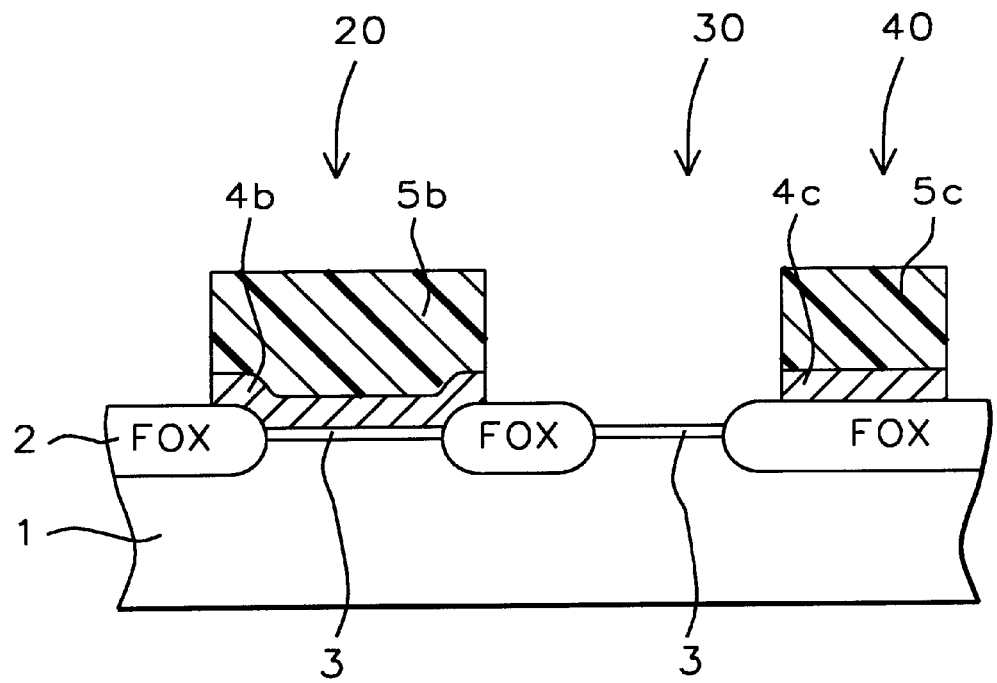
Figure 3:
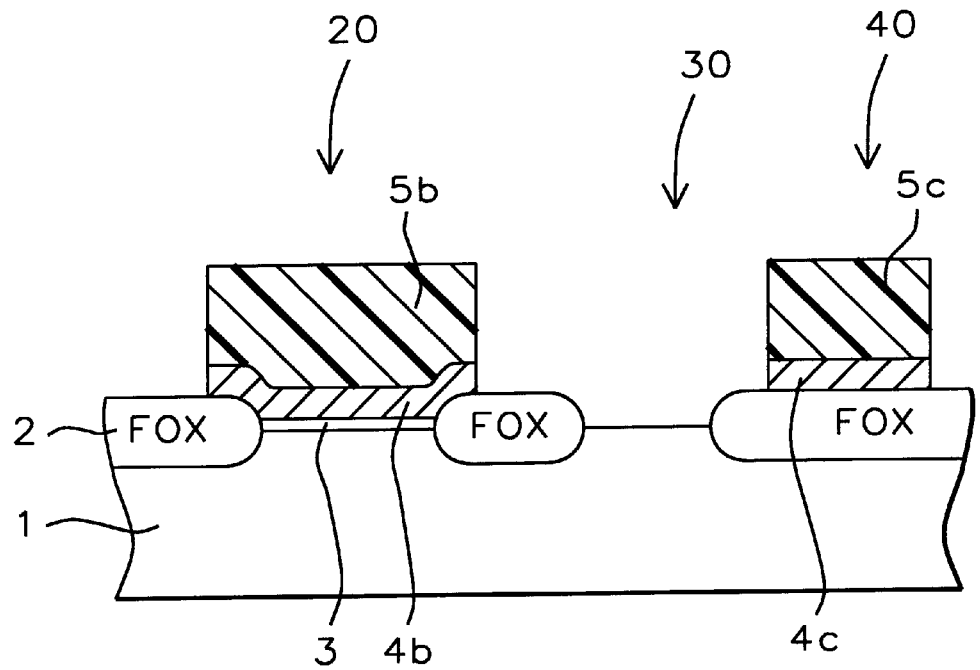

Photoresist shape 5b, and photoresist shape 5c, are used as etch masks, to allow the patterning of first polysilicon layer 4a, to be performed. A reactive ion etching, (RIE), procedure, using $Cl_2$ as an etchant, is used to completely remove first polysilicon layer 4a, from device region 30, while also creating polysilicon shape 4b, overlying first gate insulator layer 3, in device region 20, and creating polysilicon shape 4c, overlying a FOX region 2, in region 40, to be used as the lower electrode shape for a subsequent capacitor structure. This is schematically shown in FIG. 2. With photoresist shapes 5b, and 5c, in place, first gate insulator layer 3, exposed in device region 30, is removed using a buffered hydrofluoric acid solution. The removal of first gate insulator layer 3, from device region 30, can also be accomplished via a RIE procedure, using $CHF_3$ as an etchant. This is schematically displayed in FIG. 3.

Figure 4:
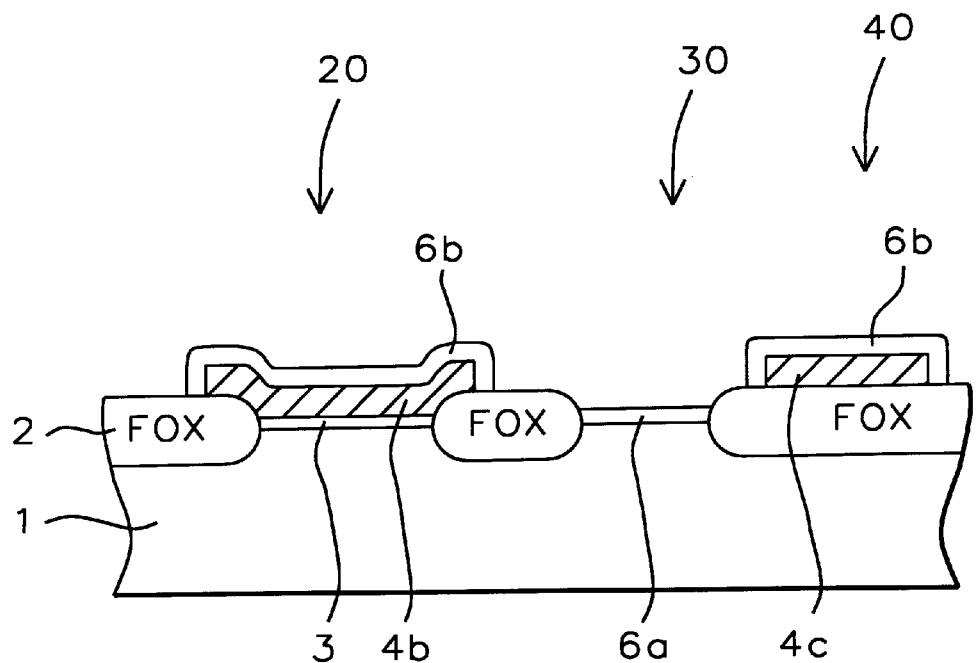

After removal of photoresist shape 5b, and photoresist shape 5c, via plasma oxygen ashing and careful wet cleans, including the use of a buffered hydrofluoric acid solution, a second gate insulator layer 6a, is formed on the surface of semiconductor substrate 1, in device region 30. Second gate insulator layer 6a, is thermally grown in an oxygen—steam ambient, at a temperature between about 800 to 1000° C. to a thickness between about 70 to 300 Angstroms. The thickness of second gate insulator layer 6a, will allow a subsequent MOSFET device, in device region 30, to operate at voltage of about 5.0 volts. The oxidation procedure also results in the formation of silicon oxide layer 6b, on polysilicon shape 4b, and on polysilicon shape 4c, at a thickness between about 100 to 500 Angstroms. Silicon oxide layer 6b, overlying polysilicon shape 4c, will be used as the capacitor dielectric layer, for a subsequent capacitor structure, in which polysilicon shape 4c, will be used as the lower electrode of the capacitor structure. This is schematically shown in FIG. 4.

A second polysilicon layer 7a, is next deposited, using LPCVD procedures, at a temperature between about 550 to 650° C., to a thickness between about 1000 to 3000 Angstroms. Second polysilicon layer 7a, can again be deposited using in situ doping procedures, via the addition of either arsine or phosphine, to a silane ambient, or second polysilicon layer 7a, can be grown intrinsically, then doped via ion implantation procedures, using either arsenic of phosphorous ions. Another iteration of this invention is the use of a polycide layer, (metal silicide-polysilicon layer), for subsequent formation of a polycide gate structure in device region 30. This is accomplished via initial deposition of a polysilicon layer, followed by the LPCVD deposition of a metal silicide layer, such as tungsten disilicide.

Figure 5:
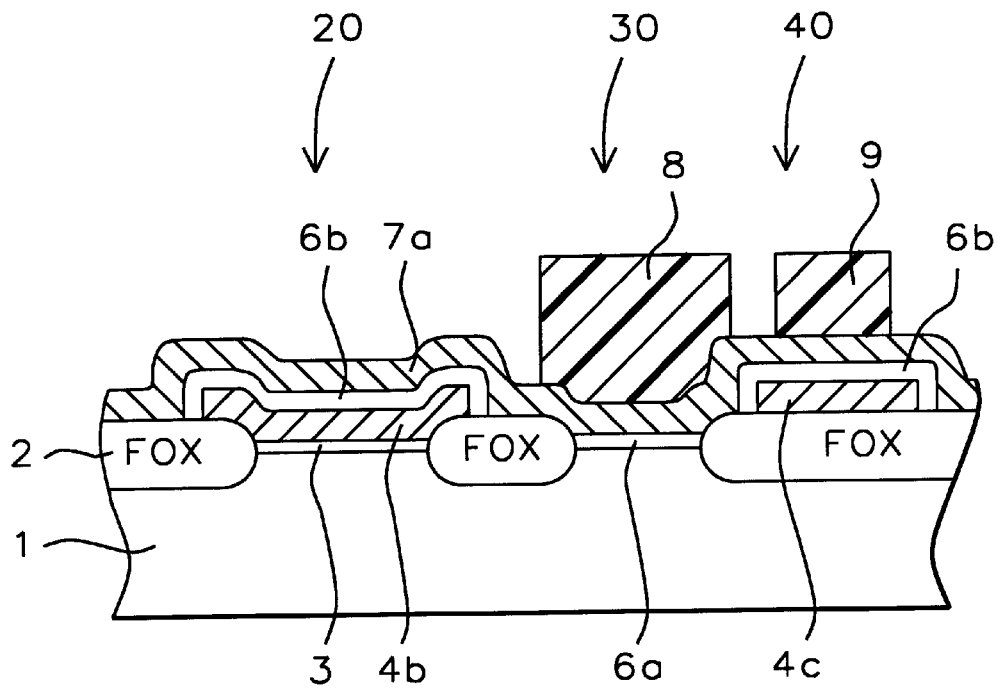
Figure 6:
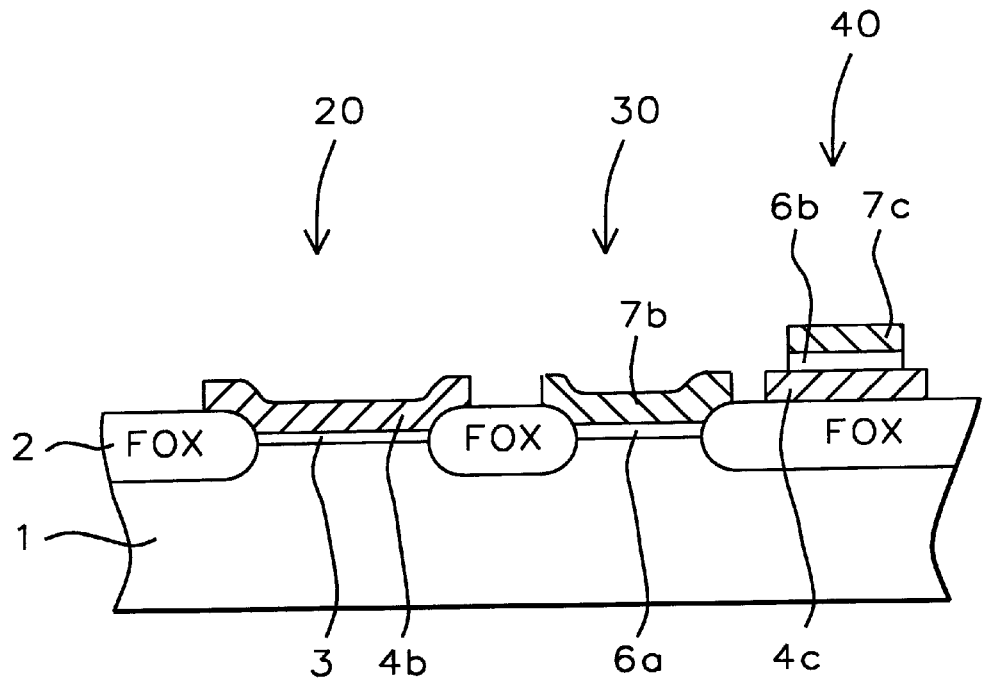

Photoresist shape 8, and photoresist shape 9, are next formed on second polysilicon layer 7a, shown schematically in FIG. 5, to be used as etch masks in device region 30, and capacitor region 40. A RIE procedure, using $Cl_2$ as an etchant is then performed to create polysilicon shape 7b, overlying second gate insulator layer 6a, in device region 30. The RIE procedure also results in the formation of polysilicon shape 7c, or the upper electrode of the capacitor structure, overlying capacitor dielectric layer 6b, in capacitor region 40. FIG. 6, schematically shows the result of this procedure, after removal of photoresist shape 8, and photoresist shape 9, via plasma oxygen ashing and careful wet cleans. The wet cleans include a buffered hydrofluoric acid procedure, used to remove silicon oxide layer 6b, from the surface of polysilicon shape 4b, and from surfaces of polysilicon shape 4c, not covered by polysilicon shape 7c.

Figure 7:
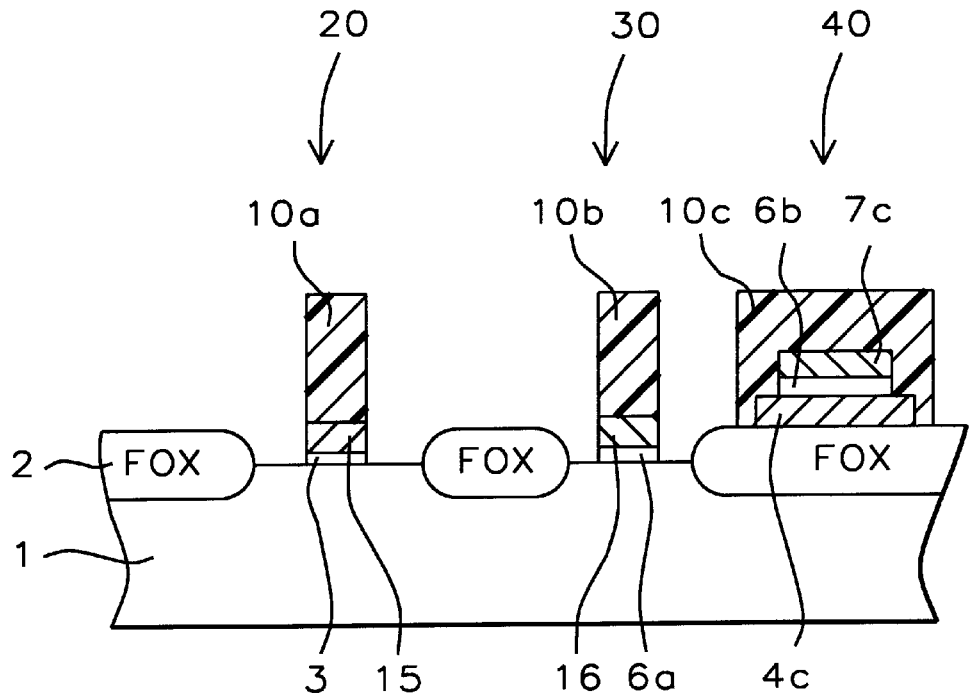

Photoresist shape 10a, and photoresist shape 10b, are next formed on polysilicon shape 4b, and polysilicon shape 7b, to be used as etch masks in the formation of polysilicon gate structures, while photoresist shape 10c, is used to protect the capacitor structure, in capacitor region 40, from a subsequent patterning procedure. Reactive ion etching, using $Cl_2$ as an etchant, is next employed to form polysilicon gate structure 15, on first gate insulator layer 3, in device region 20, while forming polysilicon gate structure 16, on second gate insulator layer 6a, in device region 30. This is schematically shown in FIG. 7.

Although this invention used a sequence of finalizing the gate electrode structures, for both device regions, using photoresist shapes 10a, and 10b, other iterations can be used to accomplish the same objective. For example the gate electrode structure, in device region 30, can be defined earlier in the sequence via use of photoresist shape 8, which now has the desired gate electrode pattern. This iteration will still use photoresist shape 10a, as the mask for the gate electrode structure, in device region 20. In addition, another iteration of this invention is the final definition of gate electrode structures, in both device regions, accomplished simultaneously via use of photoresist shape 8, for the gate electrode structure in device region 30, while forming, and using another photoresist shape, for definition of the gate electrode structure in device region 20.

Figure 8:
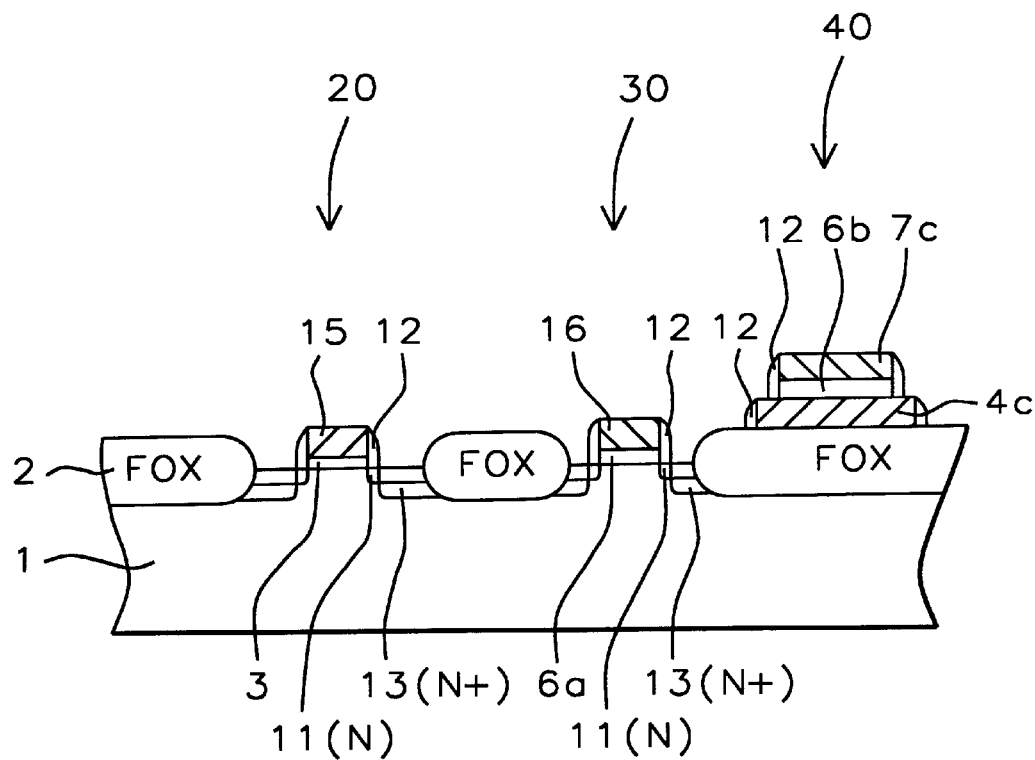

After removal of photoresist shapes 10a, 10b, and 10c, via plasma oxygen ashing and careful wet cleans, the completion of the MOSFET structures, for device regions 20, and 30 are addressed. A lightly doped source and drain region 11, is first formed, in regions not covered by polysilicon gate structures 15 and 16, via ion implantation of either arsenic or phosphorous, at an energy between about 20 to 60 KeV, at a dose between about 1E13 to 1E14 atoms/cm$^2$. Formation of sidewall spacers 12, on the exposed sides of polysilicon gate structures 15 and 16, as well as on the exposed sides of lower electrode shape 4c, and on the exposed sides of upper electrode shape 7c, is accomplished by initially depositing a silicon oxide layer, using LPCVD or plasma enhanced chemical vapor deposition, (PECVD), procedures, to a thickness between about 1000 to 2500 Angstroms, followed by an anisotropic RIE procedure, using $CHF_3$ as a etchant, creating sidewall spacers 12. Finally heavily doped source and drain regions 13, are formed in regions not covered by polysilicon gate structures 15 and 16, and sidewall spacers 12, via ion implantation of arsenic or phosphorous, at an energy between about 20 to 50 KeV, at a dose between about 1E15 to 1E16 atoms/cm$^2$. This is schematically shown in FIG. 8.

The MOSFET device structure, in device region 20, comprised of a thin, first gate insulator layer, can be used for internal operation at voltages of between about 2.5 to 3.3 volts, reducing the reliability risk of hot electron injection. The MOSFET device structure, in device region 30, formed on the thicker, second gate insulator layer, can used for I/O operations, for peripheral devices, operating at the higher voltage levels of about 5.0 volts. Both MOSFET devices were formed without covering the semiconductor surface with photoresist layers, prior to gate insulator formation. This avoidance allowed high quality, gate insulator layers, to be obtained. In addition the capacitor structure formed in capacitor region 40, was formed using a mixed mode process, comprised of first polysilicon layer used for the capacitor lower electrode shape, the second polysilicon layer used as the capacitor upper electrode shape, while the second gate insulator layer, was used for the capacitor dielectric layer. Although the MOSFET devices, used in this invention were described as N channel devices, if desired P channel MOSFET devices can easily be substituted, via the addition of an N well region, in the P type substrate, and the use of P type source and drain regions.

While this invention has been particularly shown and described with reference to the preferred embodiments thereof, it will be understood by those skilled in the art that various changes in form and details may be made without departing from the spirit and scope of this invention.

What is claimed is:

1. A method for integrating metal oxide semiconductor field effect transistor (MOSFET) devices and a capacitor structure, on a semiconductor substrate, comprising the steps of:

forming a first MOSFET device, in a first region of said semiconductor substrate, comprised of a first polysilicon gate structure, formed from a first polysilicon layer, on a first gate insulator layer;

forming a second MOSFET device, in a second region of said semiconductor substrate, comprised of a second polysilicon gate structure, formed from a second polysilicon layer, on a second gate insulator layer which formed during a second gate insulator oxidation procedure; and forming a capacitor structure, on an isolation layer, in a third region of said semiconductor substrate, comprised of a lower electrode, formed from said first polysilicon layer, a capacitor dielectric layer, formed during the second gate insulator oxidation procedure, and an upper electrode, formed from said second polysilicon layer.

2. The method of claim 1, wherein said first gate insulator layer, used for said first MOSFET device, is a silicon dioxide layer, thermally grown in an oxygen—steam ambient, at a temperature between about 800 to 1000° C. to a thickness between about 40 to 200 Angstroms.

3. The method of claim 1, wherein said first polysilicon layer is deposited using low pressure chemical vapor deposition (LPCVD) procedures, at a temperature between about 550 to 650° C. to a thickness between about 1000 to 3000 Angstroms.

4. The method of claim 1, wherein said first polysilicon gate structure, used for said first MOSFET device, is formed via an anisotropic reactive ion etch (RIE) procedure, applied to said first polysilicon layer, using $Cl_2$ as an etchant.

5. The method of claim 1, wherein said second gate insulator layer, used for said second MOSFET device, is a silicon dioxide layer, thermally grown in an oxygen—steam ambient, at a temperature between about 800 to 1000° C. to a thickness between about 70 to 300 Angstroms.

6. The method of claim 1, wherein said capacitor dielectric layer, is a silicon oxide layer, formed during said second gate insulator oxidation procedure, to a thickness between about 100 to 500 Angstroms.

7. The method of claim 1, wherein said second polysilicon layer is deposited using LPCVD procedures, at a temperature between about 550 to 650° C. to a thickness between about 1000 to 3000 Angstroms.

8. The method of claim 1, wherein said second polysilicon gate structure, used for said second MOSFET device, is formed via an anisotropic RIE procedure, applied to said second polysilicon layer, using $Cl_2$ as an etchant.

9. The method of claim 1, wherein a polycide gate structure, comprised of an overlying tungsten disilicide layer, and an underlying polysilicon layer, is used for a gate electrode structure for said second MOSFET device.

10. The method of claim 1, wherein said capacitor structure is formed by: anisotropic RIE of said first polysilicon layer, using $Cl_2$ as an etchant, creating said lower electrode; growing said capacitor dielectric layer on said lower electrode; and forming said upper electrode via an anisotropic RIE procedure, using $Cl_2$ as an etchant, applied to said second polysilicon layer.

11. A method for integrating the formation of MOSFET devices, with different gate insulator layer thicknesses, and a capacitor structure, on a semiconductor substrate, comprising the steps of:

forming isolation regions in said semiconductor substrate;

growing a first gate insulator layer in regions of said semiconductor substrate not covered by said isolation regions;

depositing a first polysilicon layer;

patterning of said first polysilicon layer to form a first polysilicon shape, on said first gate insulator layer, in a first region of said semiconductor substrate, and patterning of said polysilicon layer to form a lower electrode shape, for said capacitor structure, on a field oxide region, in a third region of said semiconductor substrate, while completely removing said first polysilicon layer, from said first gate insulator layer, in a second region of said semiconductor substrate;

removing said first gate insulator layer, in said second region of said semiconductor substrate;

thermally growing an insulator layer on said second region of said semiconductor substrate, to be used as a second gate insulator layer;

thermally growing said insulator layer on said first polysilicon shape, in said first region of said semiconductor substrate;

thermally growing said insulator layer, to be used as a capacitor dielectric layer, on said lower electrode shape, of said capacitor structure, in said third region of said semiconductor substrate;

depositing a second polysilicon layer;

patterning of said second polysilicon layer to form a second polysilicon shape on said second gate insulator layer, and patterning of said second polysilicon layer to form an upper electrode shape, on said capacitor dielectric layer, for said capacitor structure, while completely removing said second polysilicon layer, and said insulator layer, from said first polysilicon shape, in said first region of said semiconductor substrate;

patterning of said first polysilicon shape, to form a first polysilicon gate structure, on said first gate insulator layer, and patterning of said second polysilicon shape, to form a second polysilicon gate structure, on said second gate insulator layer;

forming source and drain regions, in said first region of said semiconductor substrate, creating a first MOSFET device, comprised of said first polysilicon gate structure, on said first gate insulator layer; and forming source and drain regions, in said second region of said semiconductor substrate, creating a second MOSFET device, comprised of said second polysilicon gate structure, on said second gate insulator layer.

12. The method of claim 11, wherein said first gate insulator layer is a silicon dioxide layer, thermally grown in an oxygen—steam ambient, at a temperature between about 800 to 1000° C. to a thickness between about 40 to 200 Angstroms.

13. The method of claim 11, wherein said first polysilicon layer is deposited using LPCVD procedures, to a thickness between about 1000 to 3000 Angstroms.

14. The method of claim 11, wherein said insulator layer, used for said second gate insulator layer, is a silicon dioxide, thermally grown in an oxygen—steam ambient, at a temperature between about 800 to 1000° C. to a thickness between about 70 to 300 Angstroms.

15. The method of claim 11, wherein said insulator layer, used for said capacitor dielectric layer, is silicon oxide, thermally grown in an oxygen—steam ambient, at a temperature between about 800 to 1000° C. to a thickness between about 100 to 500 Angstroms.

16. The method of claim 11, wherein said second polysilicon layer is deposited using LPCVD procedures, to a thickness between about 1000 to 3000 Angstroms.

17. The method of claim 11, wherein said first polysilicon gate structure, on said first gate insulator layer, is formed from said first polysilicon shape via an anisotropic RIE procedure, using $Cl_2$ as an etchant.

18. The method of claim 11, wherein said second polysilicon gate structure, on said second gate insulator layer, is formed from said second polysilicon shape via an anisotropic RIE procedure, using $Cl_2$ as an etchant.

19. The method of claim 11, wherein the second gate electrode, on said second gate insulator layer, is a polycide structure, comprised of tungsten disilicide on polysilicon.

20. The method of claim 11, wherein said capacitor structure is formed via an anisotropic RIE procedure, using $Cl_2$ as an etchant, to form said upper electrode shape, on said capacitor dielectric layer, from said second polysilicon layer, and to form said lower electrode shape, on said field oxide region, from said first polysilicon layer.

21. The method of claim 11, wherein said second polysilicon gate structure, and said first polysilicon gate structure, are formed during the same patterning procedure.

22. The method of claim 11, wherein said second polysilicon gate structure can be defined using a first patterning process, while said first polysilicon gate structure is defined using a second patterning process, performed at a later stage of MOSFET process, than said first patterning process.

* * * * *